(12) United States Patent
Hung

(10) Patent No.: US 9,728,852 B2
(45) Date of Patent: Aug. 8, 2017

(54) MATCHING CIRCUIT FOR ANTENNA AND ASSOCIATED METHOD

(71) Applicant: MEDIATEK Inc., Hsin-Chu (TW)

(72) Inventor: Chung-Yu Hung, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 149 days.

(21) Appl. No.: 14/447,676

(22) Filed: Jul. 31, 2014

(65) Prior Publication Data

US 2016/0036126 A1 Feb. 4, 2016

(51) Int. Cl.
*H03H 7/38* (2006.01)
*H01Q 5/335* (2015.01)
*H01Q 9/42* (2006.01)

(52) U.S. Cl.
CPC ............ *H01Q 5/335* (2015.01); *H03H 7/38* (2013.01); *H01Q 9/42* (2013.01)

(58) Field of Classification Search
CPC ............ H01Q 5/335; H01Q 1/50; H03H 7/38
USPC ................... 343/850, 852, 860, 861
See application file for complete search history.

(56) References Cited

U.S. PATENT DOCUMENTS

| 6,255,994 | B1* | 7/2001 | Saito | H01Q 1/38 343/700 MS |
| 6,643,497 | B1* | 11/2003 | Kouyama | H03H 7/38 343/850 |
| 6,693,594 | B2* | 2/2004 | Pankinaho | H01Q 1/243 343/700 MS |
| 6,765,536 | B2 | 7/2004 | Phillips et al. | |
| 7,079,079 | B2* | 7/2006 | Jo | H01Q 1/243 343/702 |
| 7,212,164 | B2* | 5/2007 | Miyano | H01Q 1/243 343/702 |
| 7,675,469 | B2 | 3/2010 | Ohba et al. | |
| 8,063,839 | B2 | 11/2011 | Ansari et al. | |
| 8,441,964 | B2* | 5/2013 | Wu | H03H 7/38 333/101 |
| 8,552,916 | B2* | 10/2013 | Hossain | H01Q 7/00 343/745 |
| 2011/0128190 | A1* | 6/2011 | Galeev | H01Q 1/243 343/702 |
| 2012/0162025 | A1* | 6/2012 | Ohno | H01Q 1/243 343/702 |
| 2013/0106672 | A1* | 5/2013 | Tung | H01Q 5/335 343/860 |

\* cited by examiner

*Primary Examiner* — Dameon E Levi
*Assistant Examiner* — Hasan Islam
(74) *Attorney, Agent, or Firm* — McClure, Qualey & Rodack, LLP

(57) ABSTRACT

A matching circuit for an antenna of whatever type, includes a ground circuit and a feed circuit. The ground circuit connects a ground terminal of the antenna to a ground voltage, and provides an inductive impedance between the ground terminal and the ground voltage. The feed circuit connects a feed signal to a feed terminal of the antenna. The feed circuit is capable of switching between a first mode and a second mode for respectively providing a first equivalent impedance and a second equivalent impedance between the feed signal and the feed terminal. An associated method is also disclosed.

13 Claims, 7 Drawing Sheets

MATCHING CIRCUIT FOR ANTENNA AND ASSOCIATED METHOD

FIELD OF THE INVENTION

The present invention relates to matching circuit for antenna and associated method, and more particularly, to an antenna matching circuit and associated method based on an architecture applicable to antennas of whatever types, i.e., an architecture independent of antenna type.

BACKGROUND OF THE INVENTION

Wireless signaling function, e.g., function to transmit and/or receive wireless (e.g., RF, radio-frequency) signals via antenna(s), has become popular, or even essential, for modern electronic devices, such as mobile phones, smart phones, tablet/handheld/portable computers, digital cameras, camcorder, media players, game consoles, wireless network peripherals (terminals, hubs, routers), printers, navigators, wearable gadgets, etc. For efficient use of wireless signaling power, an antenna is equipped with a matching circuit (matching network), so as to match impedance of the antenna, and hence reduce reflection (return loss) due to impedance mismatch.

Modern wireless standard requires wireless signaling to be carried out at multiple bands distributed over a wide frequency range. For example, to support LTE (Long Term Evolution) telecommunication standard, wireless signaling not only needs to be implemented at conventional bands of 2G and 3G standards, but also at additional bands such as 700 MHz to 821 MHz and 2300 MHz to 2690 MHz. However, supporting bands over such broad frequency range is difficult to fulfill by traditional antenna design methodology.

Antenna design is also challenged by demand of compact antenna dimensions. Size (e.g., width, length and/or area) of antenna is expected to be small due to the following reasons. For extensive interconnectivity, modern electronic device needs to include supports for multiple wireless standards, such as mobile telecommunication (2G/3G/LTE), NFC (Near-Field Communication), GPS (Global Positioning System), Bluetooth, and/or Wi-Fi, etc. Since electronic device has to include different antennas for different wireless standards, space for each antenna is therefore reduced.

Modern electronic device is also required to integrate many function modules (e.g., dual speakers for stereo audio playback, dual microphones, cameras for capturing 3-dimensional images, high capacity battery, etc) into a compact form factor, and room for each antenna is consequently compromised. In addition, for improved physical robustness and better user experience, modern electronic device tends to adopt metallic housing, which also suppresses area left for antenna since antenna should be apart from metallic part.

SUMMARY OF THE INVENTION

To address issues difficult to be solved by antenna design, the invention discloses a low-cost antenna matching circuit to overcome unsatisfactory characteristics of antenna, e.g., antenna impedance which is difficult to be matched at multiple bands distributed over broad frequency range. The matching circuit according to the invention may be implemented by inexpensive tunable elements like diode(s) and/or switch(es), so as to reduce implement cost by avoiding use of expensive tunable capacitors and tuning module. Conventionally, architecture of a matching circuit is tailored for, and applicable to, only a particular kind of antenna, thus different kinds of antennas need respective matching circuits of different architectures. However, according to the invention, architecture of the proposed matching circuit is independent of antenna type; that is, architecture of the proposed matching circuit can be extensively applicable to different kinds of antennas.

An objective of the invention is providing a matching circuit for an antenna of whatever type. That is, architecture of the antenna matching circuit is applicable to whatever types of antennas, i.e., is an independent of antenna type. The matching circuit includes a ground circuit and a feed circuit. The ground circuit is for connecting a ground terminal of the antenna to a ground voltage, and capable of providing an inductive impedance between the ground terminal and the ground voltage; for example, the ground circuit may include a ground inductor coupled between the ground terminal and the ground voltage.

The feed circuit is for connecting a feed signal to a feed terminal of the antenna. In an embodiment, the feed circuit is capable of switching between a first mode and a second mode for respectively providing a first equivalent impedance and a second equivalent impedance between the feed signal and the feed terminal, wherein the first equivalent impedance may differ from the second equivalent impedance. In an embodiment, the first equivalent impedance may enable antenna signaling (e.g., transmitting and/or receiving signals via the antenna) at a first band, the second equivalent impedance may enable antenna signaling at a second band and a third band; and, frequency of the first band may be lower than frequency of the second band and frequency of the third band.

The feed circuit may include a front stage, a first middle impedance, a second middle impedance, a switch and a shunt capacitor coupled between the feed terminal and the ground voltage. The front stage is coupled between the feed signal and an internal node, and may include a front serial inductor coupled between the feed signal and the internal node, and a front shunt inductor coupled between the internal node and the ground voltage. The first middle impedance is coupled between a first selection node and the feed terminal, and may include a middle inductor coupled between the first selection node and the feed terminal. The second middle impedance is coupled between a second selection node and the feed terminal, and may include a middle capacitor coupled between the second selection node and the feed terminal. The switch is coupled between the internal node, the first selection node and the second selection node. The switch is capable of conducting the internal node to the first selection node during the first mode, and conducting the internal node to the second selection node during the second mode.

In an embodiment, the switch may include an SPDT (Single-Pole-Double-Throw); alternatively, the switch may include a diode or diodes.

In an embodiment, the feed circuit may include a front stage, a first middle stage, a second middle stage, and a switch. The front stage is coupled between the feed signal and an internal node. The first middle stage is coupled between the internal node and the feed terminal. The second middle stage is coupled between a selection node and the feed terminal. The switch is coupled between the internal node and the selection node. The switch is capable of conducting the internal node to the selection node during the first mode, and insulating the internal node from the selection node during the second mode.

Architecture of the proposed matching circuit is independent of antenna type; for example, matching circuits of the same architecture can be respectively applied to a dual branch planar inverted F antenna, and a single branch planar inverted F antenna. Though a single branch antenna may provide multiple bands, typically only one of the bands can be well manipulated and matched; the remaining bands are difficult to be matched, and then can hardly be utilized for telecommunication. However, with the matching circuit of the invention, even the single branch antenna can provide multiple useful bands for telecommunication, because architecture of the matching circuit can ease matching of single branch antenna over broad frequency range.

An objective of the invention is providing a method for providing (such as designing and/or implementing) a matching circuit for an antenna. The method includes: independent of antenna type, arranging a ground circuit for connecting a ground terminal of the antenna to a ground voltage, and for providing an inductive impedance between the ground terminal and the ground voltage; and, independent of antenna type, arranging a feed circuit for connecting a feed signal to a feed terminal of the antenna. That is, same architectures of the ground circuit and the feed circuit can be generally leveraged to match different types of antennas. An architecture of a given circuit describes included element(s) (e.g., passive and/or active component(s)) of the given circuit, as well as interconnection of the element(s), while parameter(s) (e.g., inductance and/or capacitance) of the element(s) may be left to be determined by other procedures, e.g., numerical simulation and/or optimization.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
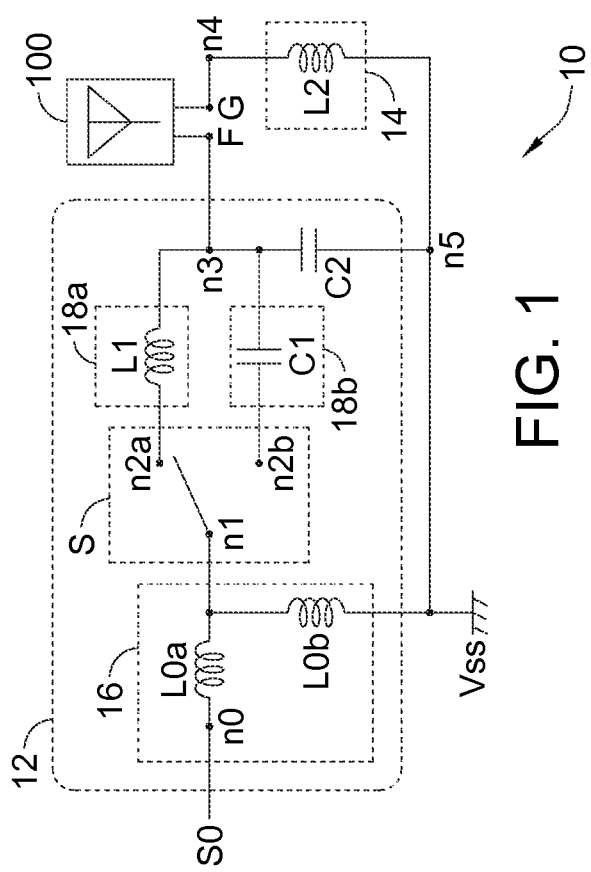
FIG. 1 illustrates a matching circuit according to an embodiment of the invention.

Please refer to FIG. 1 illustrating a matching circuit 10 for an antenna 100. The matching circuit 10 may be arranged to match impedance of the antenna 100, and may include a feed circuit 12 and a ground circuit 14. The feed circuit 12 may be arranged to connect a time-varying feed signal S0 to a feed terminal F of the antenna 100, respectively at nodes n0 and n3. For example, the signal S0 may be an RF signal provided by a signaling chip (not shown) or a signal relaying chip (e.g., transmission module, not shown), so the signal S0 can be transmitted via the matching circuit 10 and the antenna 100; the signal S0 may also be an RF signal received via the antenna 100 and the matching circuit 10. The ground circuit 14 may be arranged to connect a ground terminal G of the antenna 100 to a ground voltage Vss (e.g., a DC voltage), respectively at nodes n4 and n5.

The ground circuit 14 is capable of providing an inductive impedance between the ground terminal G and the ground voltage Vss, i.e., between the nodes n4 and n5. As shown in FIG. 1, the ground circuit 14 may includes an inductor L2 (as a ground inductor) coupled between the ground terminal G and the ground voltage Vss. The impedance provided by the ground circuit 14 can significantly reduce antenna matching effort by placing antenna impedance, on Smith chart, to locations of easy matching, and therefore greatly extend usable bandwidth of the antenna 100.

In an embodiment, the feed circuit 12 is capable of switching between a first mode and a second mode for respectively providing a first equivalent impedance and a second equivalent impedance between the nodes n0 and n3, i.e., between the feed signal S0 and the feed terminal F. In other embodiments, the feed circuit may switch among more than two modes to provide more than two equivalent impedances between the feed signal S0 and the feed terminal F. As shown in the example of FIG. 1, the feed circuit 12 may include a front stage 16, two (first and second) middle impedances 18a and 18b, a switch S, and a capacitor C2 (as a shunt capacitor). The front stage 16 may be coupled between the feed signal S0 (at the node n0) and a node n1 (an internal node). For example, the front stage 16 may include two inductors L0a and L0b (as a front serial inductor and a front shunt inductor); the inductor L0a may be coupled between the nodes n0 and n1, the inductor L0b may be coupled between the nodes n1 and n5. The capacitor C2 may be coupled between the nodes n3 and n5.

The middle impedance 18a may be coupled between a node n2a (a first selection node) and the feed terminal F at the node n3, and the other middle impedance 18b may be coupled between a node n2b (a second selection node) and the node n3. For example, the impedance 18a may include an inductor L1 (as a middle inductor) to provide an inductive impedance, and the impedance 18b may include a capacitor C1 (as a middle capacitor) to provide a capacitive impedance. The switch S may be coupled between the nodes n1, n2a and n2b. During the first mode, the switch S is capable of conducting the node n1 to the node n2a, and may be further capable of insulating the node n1 from the node n2b. During the second mode, the switch S is capable of conducting the node n1 to the node n2b, and may be further capable of insulating the node n1 from the node n2a. For example, the switch S may be an SPDT, and be controlled by a control signal (not shown) provided by an application processor (not shown), a baseband processor (not shown) or any other control circuit.

In some embodiments, the matching circuit 10 may be a circuit external to the chip supplying and/or receiving the signal S0, e.g., each element (component) of the matching circuit 10, e.g., each of the inductors L0a, L0b, L1, L2, the capacitors C1 and C2, as well as the switch S, may be a lumped off-chip element. In other embodiments, the matching circuit 10 may be an on-chip circuit, for example, integrated into the RF integrated circuit (IC) which provides and/or receives the signal S0. In still other embodiments, the matching circuit 10 may be jointly formed by an off-chip portion and an on-chip portion; e.g., one or some elements may be lumped off-chip element(s), and the rest element(s) may be integrated into the chip.

Figure 2:
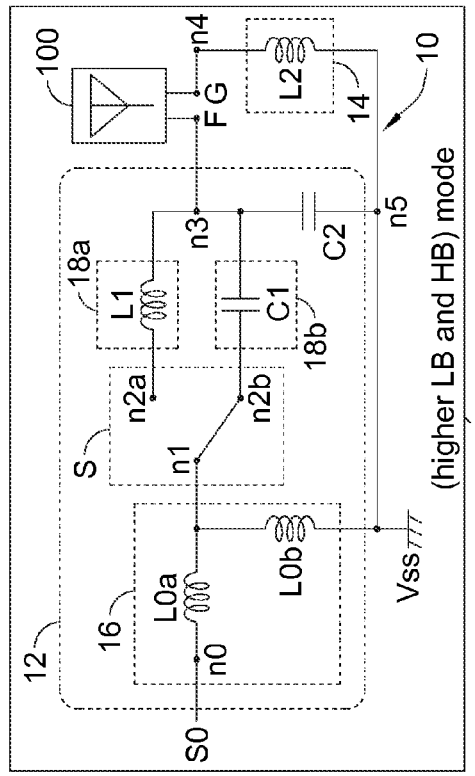
FIG. 2 exemplarily illustrates multi-mode operation of the matching circuit shown in FIG. 1.
Figure 2:
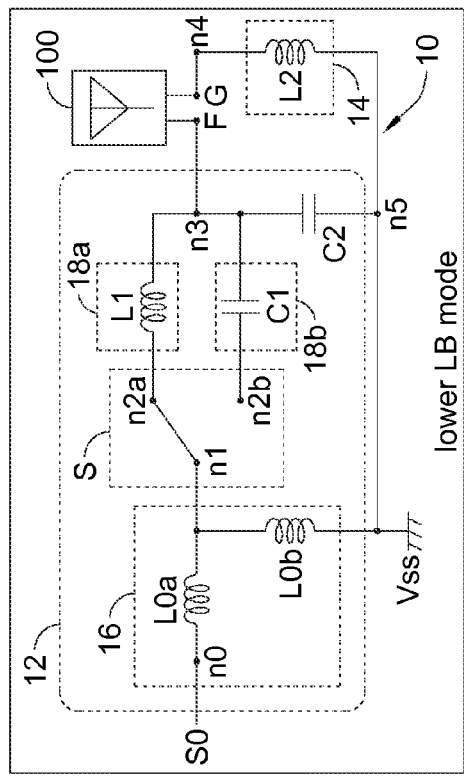
Figure 2:
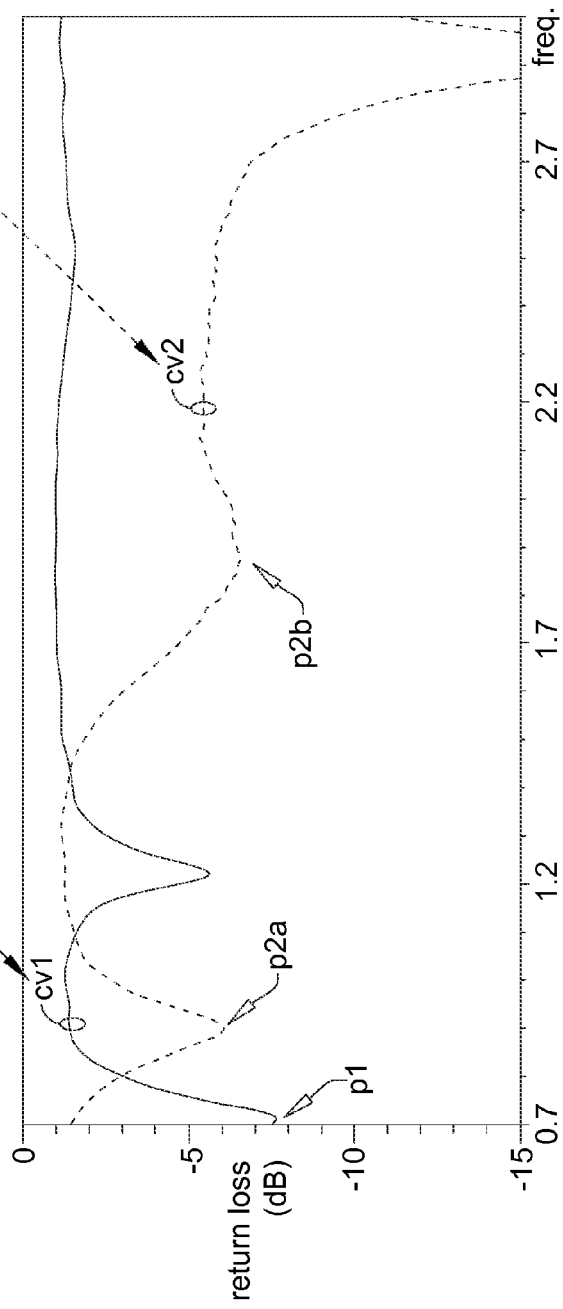

Continuing the embodiment of FIG. 1, please refer to FIG. 2 illustrating operation and a performance example of the matching circuit 10 respectively during the first mode and the second mode, wherein the first mode may support wireless signaling at a lower LB (low-band, i.e., low-frequency band), and the second mode may support wireless signaling at a higher LB and an HB (high-band, i.e., high-frequency band); frequency of the lower LB may be lower than frequency of the higher LB and frequency of the HB. FIG. 2 also illustrates two exemplary curves cv1 and cv2 which respectively describe how return loss (longitudinal axis) at the node n0 varies with frequency (transverse axis) during the first and second modes.

During the first mode when the switch S conducts between the nodes n1 and n2a (instead of n2b), the inductors L0a, L0b, L1 and the capacitor C2 provide the first equivalent impedance between the nodes n0 and n3, so the resultant curve cv1 may have a low-loss valley (notch) p1 at around 700~800 MHz suitable for wireless signaling at lower LB. During the second mode when the switch S conducts between the nodes n1 and n2b (instead of n2a), the inductors L0a, L0b and the capacitors C1 and C2 provide the second equivalent impedance between the nodes n0 and n3, so the resultant curve cv2 may have low-loss valleys p2a and p2b at around 800~1000 MHz and 1700~2700 MHz, suitable for wireless signaling at higher LB and HB, respectively. With the two modes, the antenna 100 can successfully support mobile telecommunication standards of 2G/3G/LTE.

Figure 3:
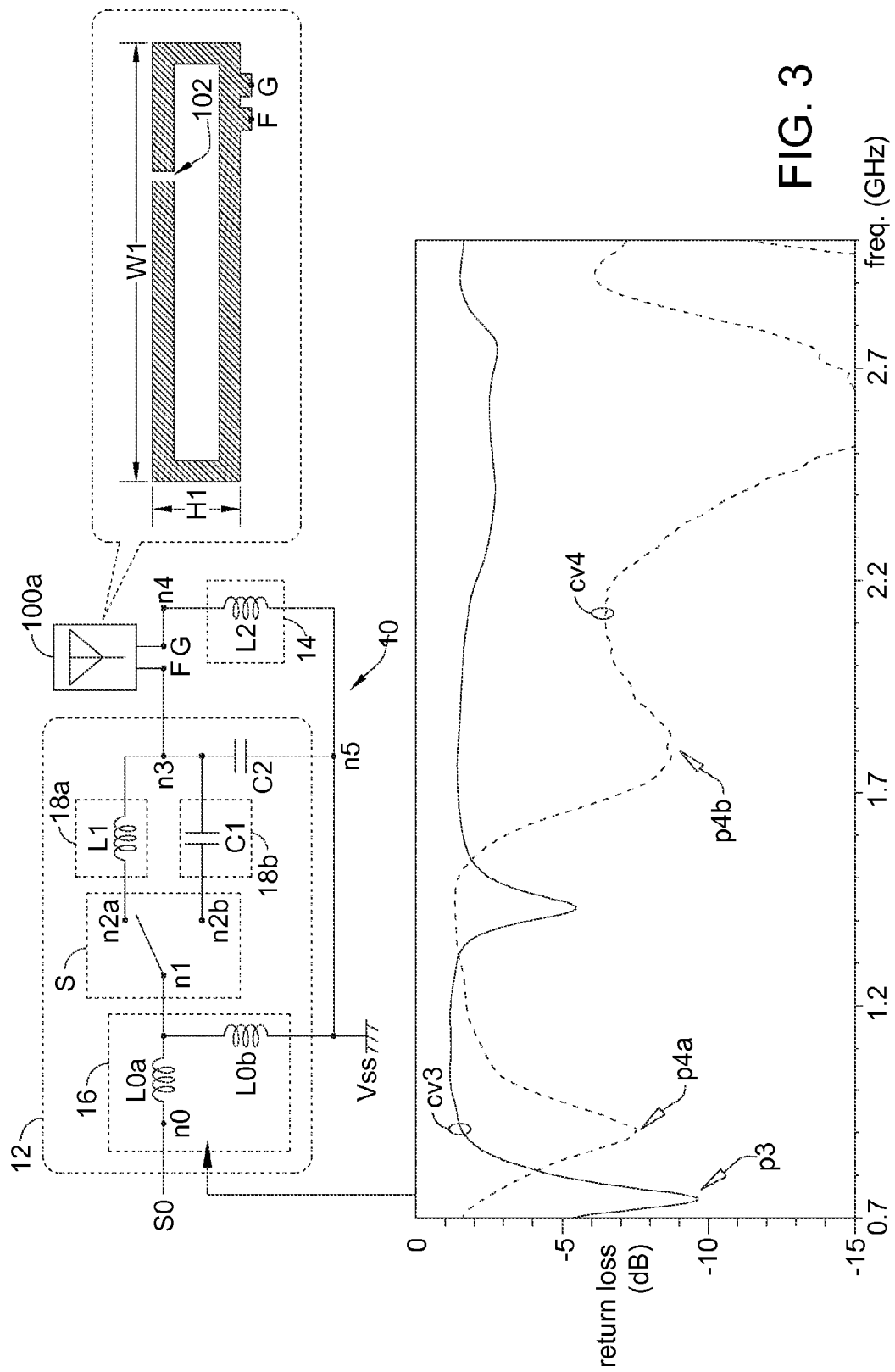
FIG. 3 and FIG. 4 demonstrate applicability and ability for matching different kinds of antennas by a same architecture shown in FIG. 1.
Figure 4:
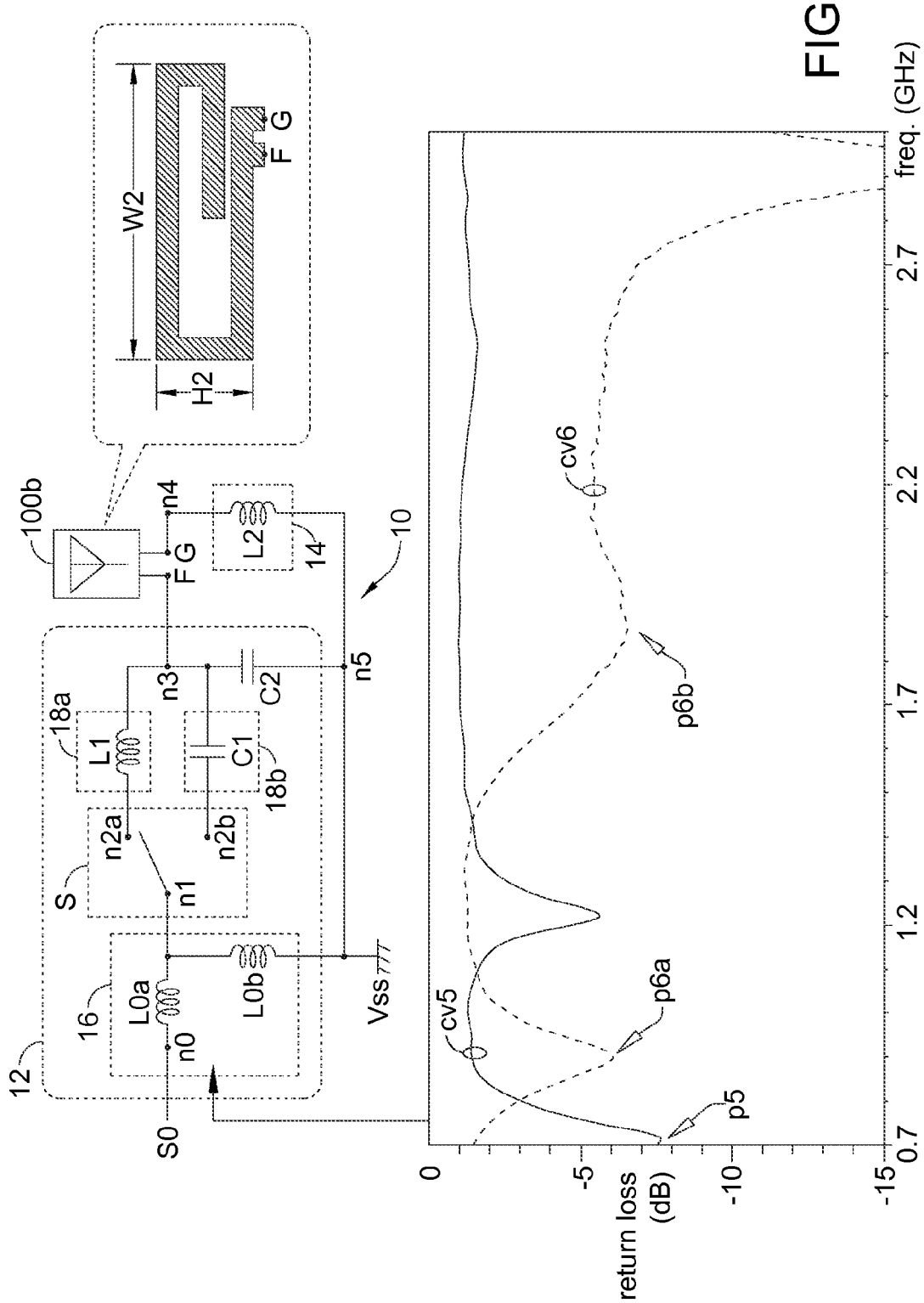

Please refer to FIG. 3 and FIG. 4 exemplarily illustrating how well the same architecture of the matching circuit 10 can match impedance for different kinds of antennas. In FIG. 3, the architecture of the matching circuit 10 is adopted for an antenna 100a, e.g., a dual branch planar inverted F antenna which is divided into two branches (arms) by a gap 102. For example, a height H1 and a width W1 of the antenna 100a may respectively be 40 mm and 8 mm; however, please note that the dimensions of branches are not limited to the example shown in FIG. 3 and can be varied according to different design requirements. When the switch S conducts between the nodes n1 and n2a to include the inductor L1 for impedance matching, a resultant return loss curve cv3 may have a low-loss valley p3 at a lower LB around 700~800 MHz. On the other hand, when the switch S conducts between the nodes n1 and n2b to include the capacitor C1 for impedance matching, a resultant return loss curve cv4 may have a low-loss valley p4a at a higher LB around 800~1000 MHz, and a low-loss valley p4b at an HB around 1700~2700 MHz.

The two branches of the antenna 100a are beneficial for broad bandwidth; however, the antenna 100a may suffer larger dimensions, such as 30~55 mm in width (W1) and 6~10 mm in height (H1). To match impedance for antenna 100a, inductance of the inductor L1 may be set to, e.g., 7~12 nH to form the curve cv3, and capacitance of the capacitor C1 may be set to, e.g., 15~25 pF to form the curve cv4.

In FIG. 4, the architecture of the matching circuit 10 may be adopted for a different kind of antenna 100b, e.g., a single branch planar inverted F antenna. For example, a height H2 and a width W2 of the antenna 100b may respectively be 26 mm and 8.5 mm; however, please note that the dimension of branch is not limited to the example shown in FIG. 4, and can be varied according to different design requirements. When the switch S conducts between the nodes n1 and n2a to include the inductor L1 for impedance matching, a resultant return loss curve cv5 may have a low-loss valley p5 at a lower LB around 700~800 MHz. On the other hand, when the switch S conducts between the nodes n1 and n2b to include the capacitor C1 for impedance matching, a resultant return loss curve cv6 may have a low-loss valley p6a at a higher LB around 800~1000 MHz, and a low-loss valley p6b at an HB around 1700~2700 MHz.

Comparing to the antenna 100a in FIG. 3, single branch of the antenna 100b in FIG. 4 is beneficial for compact dimensions, such as 15~30 mm in width (W2) and 6~10 mm in height (H2), but the antenna 100b itself may suffer a much narrower bandwidth. However, the matching circuit 10 can successfully extend usable bandwidth of the antenna 100b, even though architecture of the matching circuit 10 remains identical for both the antennas 100a and 100b. With superior band-extending ability of the matching circuit 10, the smaller antenna 100b in FIG. 3, though of narrow bandwidth in nature, can well support 2G/3G/LTE telecommunication, just as the larger antenna 100a in FIG. 4. To match impedance for antenna 100b, inductance of the inductor L1 may be set to, e.g., 6~10 nH to form the curve cv5, and capacitance of the capacitor C1 may be set to, e.g., 7~15 pF to form the curve cv6.

Figure 5:
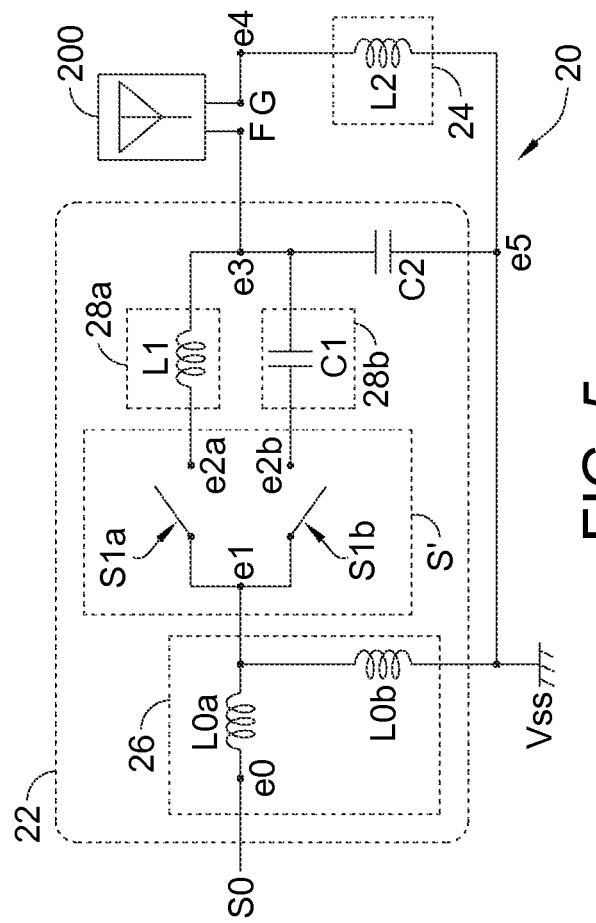
FIG. 5 illustrates a matching circuit according to an embodiment of the invention.

Please refer to FIG. 5 illustrating a matching circuit 20 according to an embodiment of the invention. Similar to the matching circuit 10 shown in FIG. 1, the matching circuit 20 in FIG. 5 may connect a signal S0 (e.g., an RF signal) at a node e0, connect a feed terminal F and a ground terminal G of an antenna 200 respectively at nodes e3 and e4, connect a ground voltage Vss (e.g., DC voltage) at a node e5, and is capable of matching impedance of the antenna 200 to provide a matched impedance between the nodes e0 and e5. The matching circuit 20 may include a feed circuit 22 and a ground circuit 24.

The ground circuit 24 may be arranged to connect the ground terminal G to the ground voltage Vss, and capable of providing an inductive impedance between the ground terminal G and the ground voltage Vss by, e.g., an inductor L2. Though conventionally the ground terminal G of the antenna 200 is directly connected to the ground voltage Vss, arranging the extra ground circuit 24 between the ground terminal G and the ground voltage Vss helps to extend usable bandwidth of the antenna 200.

The feed circuit 22 may be arranged to connect the signal S0 to the feed terminal F of the antenna 200. The feed circuit 22 may include a front stage 26 coupled between the node e0 and a node e1, a switch S' coupled between the node e1 and two nodes e2a and e2b, a middle impedance 28a coupled between the node e2a and e3, a middle impedance 28b coupled between the node e2b and e3, and a capacitor C2 coupled between the nodes e3 and e5. The front stage 26 may include tow inductors L0a and L0b; the inductor L0a may be coupled between the nodes e0 and e1, and the inductor L0b may be coupled between the nodes e1 and e5. The impedance 28a may include an inductor L1, and the impedance 28b may include a capacitor C1.

Similar to the matching circuit 10 in FIG. 1, the matching circuit 20 in FIG. 5 is capable of switching between a first mode and a second mode. In other embodiments, the matching circuit may switch among more than two modes. One difference between the matching circuits 10 (FIG. 1) and 20 (FIG. 5) is that the switch S' in FIG. 5 may include two switch units S1a and S1b. The switch unit S1a may be coupled between the nodes e1 and e2a, and capable of selectively conducting between the nodes e1 and e2a. The switch unit S1b may be coupled between the nodes e1 and e2b, and capable of selectively conducting between the nodes e1 and e2b. In an embodiment, the switch units S1a and S1b may conduct in a complementarily manner: during the first mode, the switch unit S1a may conduct between the nodes e1 and e2a, and the switch unit S1b may stop conducting between the nodes e1 and e2b; during the second mode, the switch unit S1b may conduct between the nodes e1 and e2b, while the switch unit S1a may stop conducting between the nodes e1 and e2a. Accordingly, during the first mode, the middle impedance 28a may be included for impedance matching along with the inductors L0a, L0b and the capacitor C2, while the middle impedance 28b may be excluded. On the other hand, during the second mode, the middle impedance 28b may be included for impedance matching, and the middle impedance 28a may be excluded. Each of the switch units S1a and S1b may be implemented by a diode. In some embodiments, each element (component) of the matching circuit 20, e.g., each of the inductors L0a, L0b, L1, L2, the capacitors C1 and C2, as well as the switch units S1a and S1b, may either be an off-chip element or an on-chip element.

Figure 6:
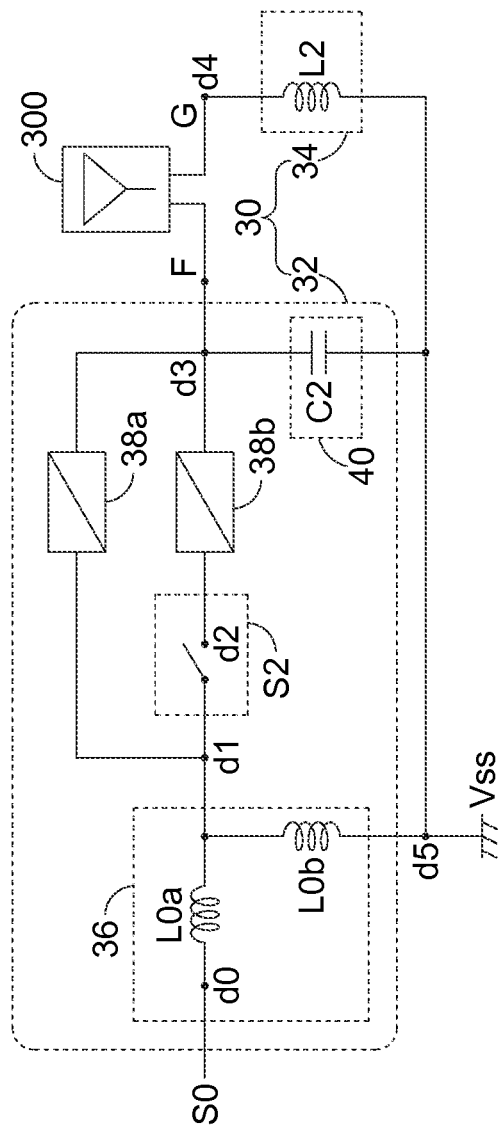
FIG. 6 illustrates a matching circuit according to an embodiment of the invention.

Please refer to FIG. 6 illustrating a matching circuit 30 according to an embodiment of the invention. The matching circuit 30 in FIG. 6 may interface a signal S0 (e.g., an RF signal) at a node d0, interface a feed terminal F and a ground terminal G of an antenna 300 respectively at nodes d3 and d4, connect a ground voltage Vss at a node d5, and is capable of matching impedance of the antenna 300 and providing a matched impedance between the nodes d0 and d5. The matching circuit 30 may include a feed circuit 32 and a ground circuit 34.

The ground circuit 34 may bridge between the ground terminal G and the ground voltage Vss, and is capable of providing an inductive impedance between the ground terminal G and the ground voltage Vss by, e.g., an inductor L2. The ground circuit 34 arranged between the ground terminal G and the ground voltage Vss is beneficial to extend usable bandwidth of the antenna 300.

The feed circuit 32 may switch between a first mode and a second mode, and may include a front stage 36, two middle stages 38a and 38b, a switch S2, and a back stage 40. In other embodiments, the feed circuit may switch among more than two modes. The front stage 36 may be coupled between the node d0 and a node d1; for example, the front stage 36 may include an inductor L0a coupled between the nodes d0 and d1, and an inductor L0b coupled between the nodes d1 and d5. The middle stage 38a may be coupled between the nodes d1 and d3; for example, the middle stage 38a may include an inductor (not shown) coupled between the nodes d1 and d3. The middle stage 38b may be coupled between a node d2 and the node d3; for example, the middle stage 38b may include a capacitor (not shown) coupled between the nodes d2 and d3. The back stage 40 may be coupled between the nodes d3 and d5; for example, the back stage 40 may include a capacitor C2 coupled between the nodes d3 and d5. The switch S2 may be coupled between the nodes d1 and d2. The switch S2 is capable of conducting the node d1 to the node d2 during the first mode, and insulating the node d1 from the d2 during the second mode. Therefore, during the first mode, both the middle stages 38a and 38b may be included to match impedance of the antenna 300; on the other hand, during the second mode, the middle stage 38b may be excluded for impedance matching.

Figure 7:
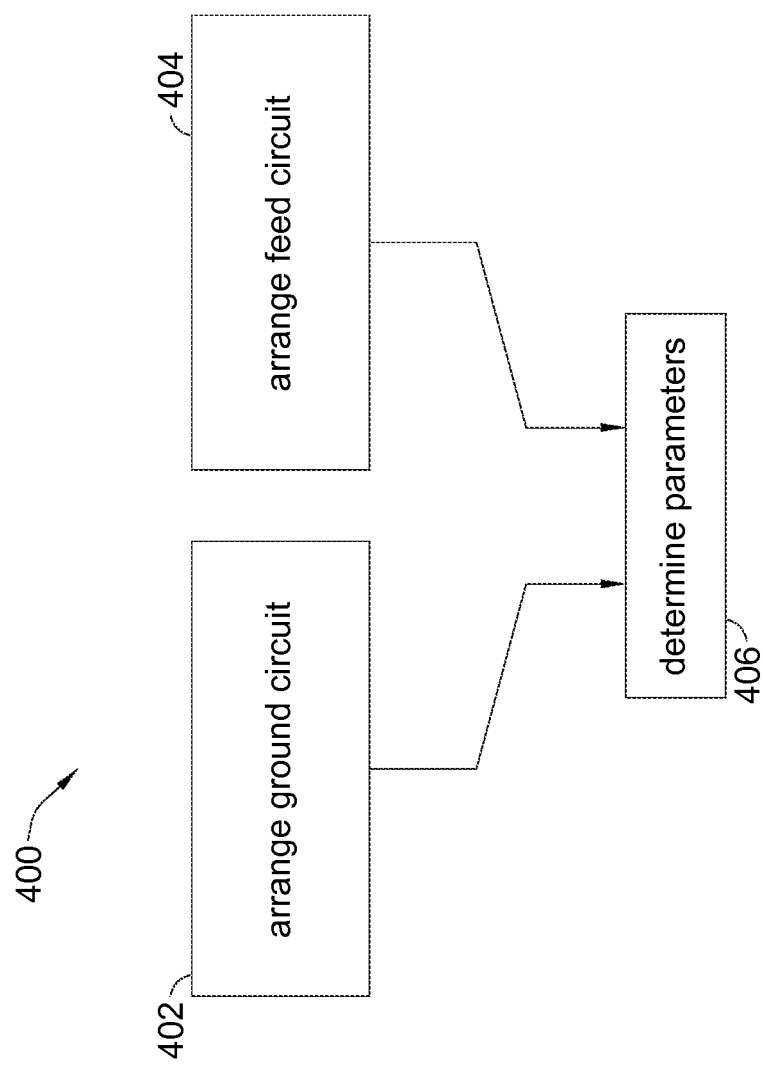
FIG. 7 illustrates a flow according to an embodiment of the invention.

Please refer to FIG. 7 illustrate a flow 400 according to an embodiment of the invention. The flow 400 is capable of providing a matching circuit (e.g., the matching circuit 10, FIG. 1) for an antenna (e.g., the antenna 100), and main steps of the flow 400 are described as follows.

Step 402: according to an architecture independent of type of the antenna, arrange a ground circuit (e.g., the ground circuit 14, FIG. 1) for connecting a ground terminal G of the antenna to a ground voltage Vss, and for providing an inductive impedance (e.g., inductance of the inductor L2) between the ground terminal G and the ground voltage Vss. For example, the architecture of the ground circuit may include an inductor (e.g., the inductor L2 coupled between the nodes n4 and n5).

Step 404: according to an architecture independent of type of the antenna, arrange a feed circuit (e.g., the feed circuit 12, FIG. 1) for connecting a feed signal S0 to a feed terminal F of the antenna. For example, to support multiple bands of multiple modes, the architecture of the feed circuit may include a front stage (e.g., the front stage 16 coupled between the nodes n0 and n1), a first middle impedance (e.g., the middle impedance 18a coupled between the nodes n2a and n3), a second middle impedance (e.g., the middle impedance 18b coupled between the nodes n2b and n3), a switch (e.g., the switch S coupled between the nodes n1, n2a and n2b), and a shunt capacitor (e.g., the capacitor C2 coupled between the nodes n3 and n5). An architecture of the front stage may include a front serial inductor (e.g., the inductor L0a coupled between the nodes n0 and n1), and a front shunt inductor (e.g., the inductor L0b coupled between the nodes n1 and n5).

Step 406: by, for example, a computer, determine parameter(s) (e.g., inductance and/or capacitance) of the elements (components) of the matching circuit architecture. For example, the parameters may be determined to reduce (minimize) return loss experienced by the signal S0 at desired bands.

Note that steps 402 and 404 may be performed concurrently or in sequential order. Besides, according to different design requirements, the steps 402 to 406 may be performed in different orders, one or more of the steps 402 to 406 may be omitted, and/or, one or more steps may be added to the flow 400. Because architecture of the matching circuit is substantially independent of antenna type, much design effort is saved.

To sum up, comparing to prior arts, the invention provides an antenna matching circuit with an architecture insensitive to antenna type; that is, the matching circuit architecture of the invention can be extensively applied to various kinds of antennas to improve intrinsic antenna characteristics, e.g., to effectively broaden bandwidth. The matching circuit architecture of the invention may also reduce instances of expensive tunable elements, so as to lower overall implement cost. Furthermore, because architecture and effectiveness (e.g., ability to extend bandwidth) of the invention is insensitive to antenna type, antenna of compact dimensions can be adopted to decrease area requirement without compromising bandwidth, even though nature of compact antenna suffers narrow bandwidth. In a typical example, comparing to a traditional broadband antenna matched by a traditional matching circuit (e.g., a matching circuit without inductive impedance between antenna ground terminal and ground voltage), a single branch compact antenna occupying only 50% area of the traditional broadband antenna can successfully maintain good support of broadband 2G/3G/LTE telecommunication just like the traditional broadband antenna, even enhance broadband performance (e.g., raise minimum power efficiency at bands distributed over broad frequency range), if matching circuit of the invention is adopted to match impedance of the single branch compact antenna.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A matching circuit for an antenna, comprising:
a ground circuit for connecting a ground terminal of the antenna to a ground voltage, and capable of providing an inductive impedance between the ground terminal and the ground voltage; and
a feed circuit for connecting a feed signal to a feed terminal of the antenna,
wherein the feed circuit is capable of switching between a first mode and a second mode for respectively providing a first equivalent impedance and a second equivalent impedance between the feed signal and the feed terminal,
wherein the feed circuit comprises:
a front stage coupled between the feed signal and an internal node;
a first middle impedance coupled between a first selection node and the feed terminal;
a second middle impedance coupled between a second selection node and the feed terminal; and
a switch coupled between the internal node, the first selection node and the second selection node, capable of conducting the internal node to the first selection node during the first mode, and conducting the internal node to the second selection node during the second mode;
wherein the front stage comprises:
a front serial inductor coupled between the feed signal and the internal node; and
a front shunt inductor coupled between the internal node and the ground voltage.

2. The matching circuit of claim 1, wherein the ground circuit comprises:
a ground inductor coupled between the ground terminal and the ground voltage.

3. The matching circuit of claim 1, wherein the feed circuit further comprises:
a shunt capacitor coupled between the feed terminal and the ground voltage.

4. The matching circuit of claim 1, wherein the switch comprises an SPDT (Single-Pole-Double-Throw).

5. The matching circuit of claim 1, wherein the switch comprises a diode.

6. The matching circuit of claim 1, wherein the first middle impedance comprises a middle inductor coupled between the first selection node and the feed terminal.

7. The matching circuit of claim 1, wherein the second middle impedance comprises a middle capacitor coupled between the second selection node and the feed terminal.

8. The matching circuit of claim 1, wherein the first equivalent impedance enables antenna signaling at a first band, the second equivalent impedance enables antenna signaling at a second band and a third band; and, a frequency of the first band is lower than a frequency of the second band and a frequency of the third band.

9. The matching circuit of claim 1, wherein the antenna is a single branch antenna.

10. The matching circuit of claim 1, wherein the antenna is a dual branch antenna.

11. A method for providing a matching circuit for an antenna, comprising:
arranging a ground circuit for connecting a ground terminal of the antenna to a ground voltage, and for providing an inductive impedance between the ground terminal and the ground voltage; and
arranging a feed circuit for connecting a feed signal to a feed terminal of the antenna,
wherein the feed circuit is capable of switching between a first mode and a second mode for respectively providing a first equivalent impedance and a second equivalent impedance between the feed signal and the feed terminal,
wherein an architecture of the feed circuit comprises:
a front stage coupled between the feed signal and an internal node;
a first middle impedance coupled between a first selection node and the feed terminal;
a second middle impedance coupled between a second selection node and the feed terminal, and
a switch coupled between the internal node, the first selection node and the second selection node, and capable of:
conducting the internal node to the first selection node during the first mode, and
conducting the internal node to the second selection node during the second mode;
wherein an architecture of the front stage comprises:
a front serial inductor coupled between the feed signal and the internal node; and
a front shunt inductor coupled between the internal node and the ground voltage.

12. The method of claim 11, wherein an architecture of the ground circuit comprises:
a ground inductor coupled between the ground terminal and the ground voltage.

13. The method of claim 11, wherein the architecture of the feed circuit further comprises:
a shunt capacitor coupled between the feed terminal and the ground voltage.

* * * * *